(12) United States Patent
Giessen et al.

(10) Patent No.: US 10,593,873 B2
(45) Date of Patent: Mar. 17, 2020

(54) DEVICE FOR SWITCHABLY INFLUENCING ELECTROMAGNETIC RADIATION, AND METHOD FOR OBTAINING SUCH A DEVICE

(71) Applicant: Baden-Wurttemberg Stiftung gGmbH, Stuttgart (DE)

(72) Inventors: Harald Giessen, Mannheim (DE); Xinghui Yin, Cambridge, MA (US)

(73) Assignee: BADEN-WURTTEMBERG STIFTUNG GGMBH, Stuttgart (DE)

( * ) Notice: Subject to any disclaimer, the term of this patent is extended or adjusted under 35 U.S.C. 154(b) by 0 days.

(21) Appl. No.: 15/992,264

(22) Filed: May 30, 2018

(65) Prior Publication Data
US 2018/0351092 A1    Dec. 6, 2018

(30) Foreign Application Priority Data
Jun. 1, 2017   (EP) .................................... 17174050

(51) Int. Cl.
*H01L 45/00* (2006.01)
*G02F 1/01* (2006.01)
*G02F 1/29* (2006.01)

(52) U.S. Cl.
CPC ............ *H01L 45/1213* (2013.01); *G02F 1/01* (2013.01); *G02F 1/0147* (2013.01); *G02F 1/29* (2013.01); *H01L 45/06* (2013.01); *G02F 2202/30* (2013.01); *G02F 2202/36* (2013.01)

(58) Field of Classification Search
CPC ............................ H01L 45/1213; H01L 45/06
See application file for complete search history.

(56) References Cited

U.S. PATENT DOCUMENTS

2006/0183625 A1 * 8/2006 Miyahara .............. C04B 35/053
501/98.4

OTHER PUBLICATIONS

Tittl et al. (A Switchable Mid-Infrared Plasmonic Perfect Absorber with Multispectral Thermal Imaging Capability. Adv. Mater. 2015,27,4597-4603) (Year: 2015).*

* cited by examiner

*Primary Examiner* — Stephen M Bradley
(74) *Attorney, Agent, or Firm* — Stephen T. Olson; Harness, Dickey & Pierce, P.L.C.

(57) ABSTRACT

A device for switchably influencing electromagnetic radiation includes a phase change material and an optically responsive structure. The phase change material is switchable between at least a first state and a second state. The first state and the second state have different electrical and/or magnetic properties. The optically responsive structure is in contact with the phase change material and has at least a first nanostructure and a second nanostructure. The first nanostructure is being different from the second nanostructure. The first nanostructure is optically responsive at a predetermined electromagnetic wavelength when the phase change material is in its first state, and non-responsive at the predetermined wavelength when the phase change material is in its second state. The second nanostructure is optically responsive at the predetermined electromagnetic wavelength when the phase change material is in its second state, and non-responsive at the predetermined wavelength when the phase change material is in its first state.

19 Claims, 3 Drawing Sheets

DEVICE FOR SWITCHABLY INFLUENCING ELECTROMAGNETIC RADIATION, AND METHOD FOR OBTAINING SUCH A DEVICE

CROSS-REFERENCE TO RELATED APPLICATIONS

This application claims priority to European Patent Application No. 17174050.9 filed 1 Jun. 2018, which application is herein expressly incorporated by reference.

FIELD

The invention is related to a device for switchably influencing electromagnetic radiation, and to a method for obtaining such a device.

BACKGROUND

The invention is related to a device for switchably influencing electromagnetic radiation, and to a method for obtaining such a device.

From Ee, H.-S. & Agarwal, R., Tunable Metasurface and Flat Optical Zoom Lens on a Stretchable Substrate, Nano Lett. 16, 2818-2823 (2016), a device for influencing electromagnetic radiation is known, wherein an optical response of the device is tuned mechanically. In particular, a distance between separate nanoresonators is changed by stretching a flexible substrate. Mechanical actuation, however, can be undesirable on a microscopic scale due to inherent space restrictions as well as intrinsic limitations on the switching speed and/or frequency. Furthermore, the flexible substrate is prone to fast degradation, thus only allowing for a small number of switching cycles. Switchable optical devices so far do not offer the possibility to switch between different optical functionalities, e.g. between zoom lensing on the one hand and beam-steering on the other hand.

SUMMARY

It is an object of the invention to provide a device for switchably influencing electromagnetic radiation as well as a method for obtaining such a device, which overcome these drawbacks.

The object of the invention is achieved by providing the subject-matter of the independent claims. Further advantageous embodiments are defined in the dependent claims.

In particular, a device for switchably influencing electromagnetic radiation is provided, which comprises a phase change material being switchable between at least a first state and a second state, the first state and the second state having electrical and/or magnetic properties different from each other. The device further comprises an optically responsive structure in contact with the phase change material, wherein the optically responsive structure has at least a first nanostructure and a second nanostructure, the first nanostructure being different from the second nanostructure. The first nanostructure is optically responsive at a predetermined electromagnetic wavelength when the phase change material is in its first state and optically non-responsive at the predetermined wavelength, when the phase change material is in its second state. At the same time, the second nanostructure is optically responsive at the predetermined electromagnetic wavelength when the phase change material is in its second state, and optically non-responsive at the predetermined wavelength when the phase change material is in its first state. Thus, the first nanostructure and the second nanostructure are adapted to show an optical response at the same wavelength but in different states of the phase change material. It is then possible to switch between the optical response of the first nanostructure and the optical response of the second nanostructure at the same wavelength by just changing the state, in particular the phase, of the phase change material, which can be done on a short timescale, in particular on a timescale which is much shorter than a timescale for mechanical actuation as known in the State of the Art. Further, the phase change material can be switched between its different states many times without degradation, such that the device exhibits a long lifetime and a large number of possible switching cycles prior to material failure.

Furthermore, the different nanostructures may have different optical functionalities, such that the device allows for switching between these different functionalities in an easy and convenient manner.

"Electromagnetic radiation" with respect to the present teachings is in particular light, preferably infrared light, visible light, or ultraviolet light.

The fact that the phase change material is switchable between the at least two different states in particular means that the phase change material may be switched at least from one of the first state and the second state to the other one of the first state and the second state. Preferably, the phase change material can also be switched back from the other state of the first and the second state to the one state of the first state and the second state. However, it is possible that the phase change material exhibits a plurality of states, wherein direct switching between adjacent states is only possible in one direction, wherein back-switching only is possible into a predetermined extremal state, e.g. the first state. Insofar, adjacent states are states which lie next to each other in a phase diagram of the phase change material, and/or which fulfill the condition that it is possible to switch directly in at least one direction between the adjacent states.

An optically responsive structure in particular is a structure which is able to influence electromagnetic radiation in a predetermined way, preferably by shaping the phasefront of electromagnetic radiation incident upon the optically responsive structure in a way determined by at least one property and/or feature of the optically responsive structure, in particular by a geometrical configuration of the optically responsive structure.

The fact that the optically responsive structure is in contact with the phase change material in particular means that the optically responsive structure is arranged in and/or on the phase change material, wherein it is possible that the optically responsive structure is embedded into the phase change material, or that the optically responsive structure is arranged on the phase change material. The optically responsive structure is in direct contact with the phase change material such that the optically responsive structure is directly influenced by electrical and/or magnetic properties of the phase change material as an environment of the optically responsive structure.

A nanostructure in particular is a structure having at least one geometrical feature, preferably a plurality of geometrical features, each geometrical feature having dimensions on a nanometer length scale, wherein preferably the dimensions of the at least one geometrical feature are smaller than the predetermined electromagnetic wavelength. The at least one geometrical feature preferably is a substantial or material building block made from a material, which is able to exhibit a plasmonic resonance at the predetermined wavelength in a suitable dielectric environment.

The first nanostructure and the second nanostructure preferably form metasurfaces, or sub-metasurfaces of a same metasurface if arranged in the same plane, a metasurfaces being an artificial material surface with sub-wavelength thickness and electromagnetic properties determined by the structure and material of the metasurface. In particular, a metasurface is adapted to impart a spatially varying phase profile through abrupt phase jumps, and thus shape a wave front of an electromagnetic wave transmitted by the metasurface.

The nanostructures being optically responsive at the predetermined electromagnetic wavelength in particular means that the nanostructures exhibit a plasmonic resonance at a predetermined electromagnetic wavelength when the phase change material is in an appropriate state. The first nanostructure is designed and adapted to the phase change material such that it exhibits a plasmonic resonance at the predetermined electromagnetic wavelength when the phase change material is in the first state, and the second nanostructure is designed and adapted to the phase change material such that it exhibits plasmonic resonance at the predetermined electromagnetic wavelength when the phase change material is in the second state. The nanostructures being non-responsive at the predetermined wavelength in particular means that they do not exhibit plasmonic resonances at the respective states of the phase change material. Thus, in particular for the first nanostructure, the plasmonic resonance is shifted away from the predetermined wavelength in the second state of the phase change material, and for the second nanostructure, the plasmonic resonance is shifted away from the predetermined wavelength when the phase change material is in the first state.

Thus, the device as suggested herein is a highly-integrated active optical component that employs a combination of resonant plasmonic metasurfaces and a phase change material, which is able to change the plasmonic resonances by changing its state.

According to a preferred embodiment of the device, the phase change material is metastable in at least the first state and the second state. Thus, it is possible to trigger a change of state in the phase change material by applying a predetermined stimulus, e.g. a laser pulse or a sequence of laser pulses, to the phase change material, wherein the phase change material is able to maintain the newly obtained state even if the stimulus is taken away. It is not necessary to control the environment of the phase change material for maintaining the current state of the phase change material, as it is the case with more simple phase change materials, wherein an environmental parameter such as temperature acts as a control parameter for not only triggering a phase change but also maintaining a certain state of the phase change material. Most preferably, the phase change material is metastable in at least the first and the second state, preferably in all its different states, over a large temperature range, in particular from well below room temperature (below 25° C.) up to a crystallization temperature or a melting temperature of the phase change material. The device is in this case applicable in an easy and convenient way without the need for a permanent control of environmental parameters.

In a preferred embodiment of the invention, the phase change material is a dielectric in at least the first state and the second state. Thus, the phase change material does not exhibit a phase transition between fundamentally different states of conductivity, for example a transition between a dielectric state on the one hand and a metallic or semiconducting state on the other hand. Preferably, the phase change material has a first dielectric constant in the first state and a second dielectric constant in the second state, wherein the first dielectric constant is different from the second dielectric constant. Preferably, there is a considerable contrast for the dielectric constant in the different states, preferably more than 150%, preferably more than 170%, preferably more than 180%, in particular 186%, at the predetermined wavelength. The dielectric constant in particular is an optical dielectric constant.

In addition or alternatively, the phase change material preferably is amorphous in the first state and crystalline in the second state. This allows for a well-defined phase change with large contrast in the optical dielectric constant between the two states.

In addition or alternatively, the phase change material has more than two different states, preferably a plurality of different states, the phase change material preferably being metastable in all of its states. In particular, each state has a respective dielectric constant, which is different from the dielectric constants assigned to the other states.

In addition or alternatively, the phase change material has a plurality of preferably metastable intermediate states between the first state and the second state. In particular, in a phase change material, which is amorphous in the first and crystalline in the second state, the intermediate states can be realized by a domain structure, the phase change material exhibiting a certain amount of crystalline domains in an amorphous bulk, or, vice versa, a certain amount of amorphous domains in a crystalline bulk, the amount of domains in relation to the bulk defining the intermediate state. The intermediate state preferably has an intermediate dielectric constant, which ranges between the first dielectric constant and the second dielectric constant. In particular, an intermediate state exhibiting a domain structure can be assigned a dielectric constant which is a mean value, in particular an arithmetic mean value, determined by the amount of domains in the bulk structure.

A phase change material having an amorphous first state and a crystalline second state, exhibiting intermediate states having a domain structure in between the first state and the second state, is an example for a phase change material being switchable between adjacent states only in one direction, in particular from a more amorphous state to a next, more crystalline state, by stepwise enhancing the crystallinity of the phase change material, in particular by generating further crystalline domains by means of laser pulses, heating or electrical switching. However, it is not possible to stepwise reduce the crystallinity of the phase change material. Rather, in order to go back to the first amorphous state, it is necessary to melt-quench the phase change material starting from any of the intermediate states or the second crystalline state. Then, the phase change material is heated for a short time above the melting temperature, and the heat is dissipated on a short timescale, preferably via an appropriate substrate on which the phase change material is arranged, or directly from the phase change material. In this way, the phase change material can be brought back in the first, amorphous state, and the new cycle of state changes can be started.

In a preferred embodiment of the invention, the phase change material is GeSbTe (GST), most preferably the phase change material is $Ge_3Sb_2Te_6$ (GST-326). GST, and in particular GST-326 are low-loss phase change materials being metastable in all possible states, exhibiting a first amorphous, a second crystalline, and domain-like intermediate states, where there is a large contrast of the optical dielectric constant between the first, amorphous state ($n_a \approx 3.5+0.001i$), to the second, crystalline state ($n_c \approx 6.5+0.06i$) at the predetermined wavelength, which is in a preferred manner for the above referenced values $\lambda=3.1$ µm.

In a preferred embodiment of the invention, the first nanostructure comprises a plurality of first nanoelements, the first nanoelements exhibiting a plasmonic resonance at the predetermined wavelength when the phase change material is in its first state, and not exhibiting a plasmonic resonance at the predetermined wavelength when the phase change material is in its second state. The second nanostructure comprises a plurality of second nanoelements, the second nanoelements exhibiting a plasmonic resonance at the predetermined wavelength when the phase change material is in its second state, and not exhibiting a plasmonic resonance at the predetermined wavelength when the phase change material is in its first state. The nanoelements preferably are nano-antennas, made from an electrically conductive material capable of collective electronic excitation, in particular at least one metal, preferably a noble metal, like gold, silver, etc., or copper, nickel, aluminium, palladium, etc.

Each single nanoelement is preferably geometrically adapted to allow for a plasmonic resonance at the predetermined wavelength in a well-defined direction, which is preferably determined by a longitudinal axis of the nanoelement. Most preferably, each nanoelement has one geometrical dimension, which is the longitudinal axis, which is much longer than the other two Cartesian geometrical dimensions. In particular each nanoelement has a length which is much longer than a width and a height of the nanoelement. Preferably, the length or longitudinal axis of the nanoelement is one order of magnitude greater than the other two dimensions, in particular the width and the height. The plasmonic resonance at the predetermined wavelength is preferably defined by the length of the nanoelement along the longitudinal axis. Most preferably, the nanoelements are configured as bars.

For example, in an embodiment, where GST-326 is used as a phase change material and the nanoelements are made of gold, when the predetermined wavelength is $\lambda=3.1$ µm, the first nanoelements can be bars having a length of 600 nm, wherein the second nanoelements are bars having a length of 370 nm, wherein the widths and heights of the bars are identical for the first and second nanoelements, the width being 50 nm and the height being 40 nm. The different lengths of the first and second nanoelements allow for plasmonic resonances at the same predetermined wavelength in the first state for the first nanoelements and in the second state for the second nanoelements due to the change in the dielectric environment.

Each nanostructure preferably consists of a plurality of such nanoelements, wherein adjacent nanoelements are separated from each other by a predetermined distance, defining a period of the nanostructure, wherein preferably adjacent nanoelements are rotated relative to each other by a predetermined angle in a plane defined by the nanostructure. If neither the period nor this predetermined angle of in-plane rotation is changed over the complete surface of the nanostructure, the rotation between the nanoelements defines a superperiod for the nanostructure. However, both the period as well as the predetermined rotational angle between adjacent nanoelements may be varied over the plane defined by the nanostructure. Insofar, it is possible that there exists a constant period, but not a constant superperiod, or even neither a constant period nor a constant superperiod throughout the whole structure.

The shaping of the phase front of incident electromagnetic radiation is mainly governed by the rotational angle between adjacent nanoelements and/or the change of this predetermined angle along the nanostructure.

In a preferred embodiment of the invention, the first nanostructure and the second nanostructure are arranged in the same plane. This allows for a very compact device.

In addition or alternatively, the first nanoelements and the second nanoelements are arranged in the same plane in a staggered configuration. The different nanoelements can preferably be arranged in rows, columns, concentric circles, etc., wherein most preferably a row, a column or a concentric circle of first nanoelements alternates with another, adjacent row, column or concentric circle of second nanoelements, and so forth. Staggering different nanostructures in one single plane is possible due to the inherent local surface plasmonic resonance property of exhibiting extinction cross-sections at resonance that are much larger than the geometrical footprints of the individual nanoelements. This allows for the nanoelements to be spaced relatively far apart from one another while retaining an effectively continuously covered surface from a light interaction viewpoint. The only limiting factor in designing staggered metasurfaces lies in avoiding propagating surface modes such as Rayleigh anomalies stemming from a periodic arrangement of the plamonic antenna elements with certain periodicities that might introduce undesired loss channels.

In particular, the first nanostructure and the second nanostructure form alternative subsets of metasurface elements, or sub-metasurfaces, in a single metasurface. Switching the state of the phase change material selectively activates one of these subsets or sub-metasurfaces.

In a preferred embodiment of the invention, the optically responsive structure comprises more than two different nanostructures, wherein preferably each nanostructure is assigned to a respective state of a plurality of states of the phase change material. Thus, it is possible to switch between a plurality of different optical functionalities and/or optical properties by activating one of the plurality of different metasurfaces or sub-metasurfaces at a time by bringing the phase change material in one of a plurality of different states adapted to the respective metasurface or sub-metasurface.

In particular, each nanostructure exhibits an optical response in one respective state of the phase change material at the predetermined wavelength, wherein the same nanostructure does not exhibit an optical response at the predetermined wavelength in any other state of the phase change material.

In a preferred embodiment of the invention, the at least first nanostructure and second nanostructure have different optical functionalities. An optical functionality is in particular a well determined way to influence electromagnetic radiation, in particular by diffraction, beam steering, lensing, and so on. If two different nanostructures have two different optical functionalities, it is possible to switch between different ways to influence electromagnetic radiation in the same device, for example to switch between beam steering on the one hand and lensing on the other hand.

In addition or in the alternative, at least two nanostructures of the first nanostructure and the second nanostructure share a same optical functionality but have different properties within the same functionality. A property within this meaning is a certain measure describing the behaviour of the optical functionality, e.g. an angle for beam steering or beam deflection, or a focal length for lensing. Such a property may also be the influence on different chiralities of the incident light, e.g. whether a nanostructure interacts with right-handed or left-handed circularly polarized light if the nanostructure has the optical functionality of a chiral beam steering device or a chiral lens. It is thus possible to selectively choose different properties for a given optical functionality, for example by realizing beam steering to different directions, or varifocal zoom lensing.

If the device has a plurality of different nanostructures, and the phase change material has a respective plurality of states a plurality meaning more than two—it is possible to choose different optical functionalities on the one hand, and additionally to switch between different properties for the same functionality on the other hand. For example, there may be a first state wherein the device deflects an incident light beam to the right, a second state wherein the incident light beam is deflected to the left, a third state wherein incident light is focused with a first focal length, and a fourth state wherein the incident light beam is focused with a second focal length being different from the first focal length.

In a preferred embodiment of the invention, the device is configured as a switchable beam steering device, and/or as a varifocal lens, and/or as a chiral lens, as already explained above. Generally, the device may exhibit any functionality for influencing electromagnetic radiation which is achievable by shaping the phase front of the electromagnetic radiation. Thus, the device is extremely versatile.

In a preferred embodiment of the invention, the phase change material is arranged on a substrate which has a thermal conductivity greater than or equal to 4 W/(mK), preferably greater than or equal to 5 W/(mK), preferably greater than or equal to 9 W/(mK). Thus, it is possible in a most easy and convenient way to switch the phase change material back from a crystalline state or a more crystalline state to an amorphous state by melt-quenching, wherein heat is dissipated from the phase change material via the substrate. Most preferably, the substrate may be made of a material selected from a group consisting of diamond, Si, and $CaF_2$.

According to another aspect of the invention, a method for obtaining a device for switchably influencing electromagnetic radiation is provided, the method comprising the steps of providing a phase change material, the phase change material being switchable between at least a first state and a second state, the first state and the second state having different electrical and/or magnetic properties; providing an optically responsive structure in contact with the phase change material by providing at least a first nanostructure and a second nanostructure in contact with the phase change material, such that the first nanostructure is different from the second nanostructure, and the first nanostructure is optically responsive at a predetermined electromagnetic wavelength when the phase change material is in its first state and non-responsive at the predetermined wavelength when the phase change material is in its second state, and the second nanostructure is optical responsive at the predetermined electromagnetic wavelength when the phase change material is in its second state and non-responsive at the predetermined wavelength when the phase change material is in its first state. In particular, the method is adapted to obtain a device according to at least one of the embodiments described above.

The phase change material may preferably be provided by depositing the same on a substrate surface. However, the phase change material may also itself serve as a substrate.

In a preferred embodiment of the invention, a plurality of nanoelements is provided for each nanostructure, the nanoelements exhibiting plasmonic resonances at the predetermined wavelength in the respective state of the phase change material assigned to the respective nanostructure, and the nanoelements being optically non-responsive in any other state of the phase change material.

In a preferred embodiment of the invention, the nanoelements of at least the first nanostructure and the second nanostructure are deposited in a same plane on the phase change material, preferably in a staggered configuration.

BEST DESCRIPTION OF THE DRAWINGS

The invention is further explained with reference to the drawing, wherein.

DETAILED DESCRIPTION

Figure 1:
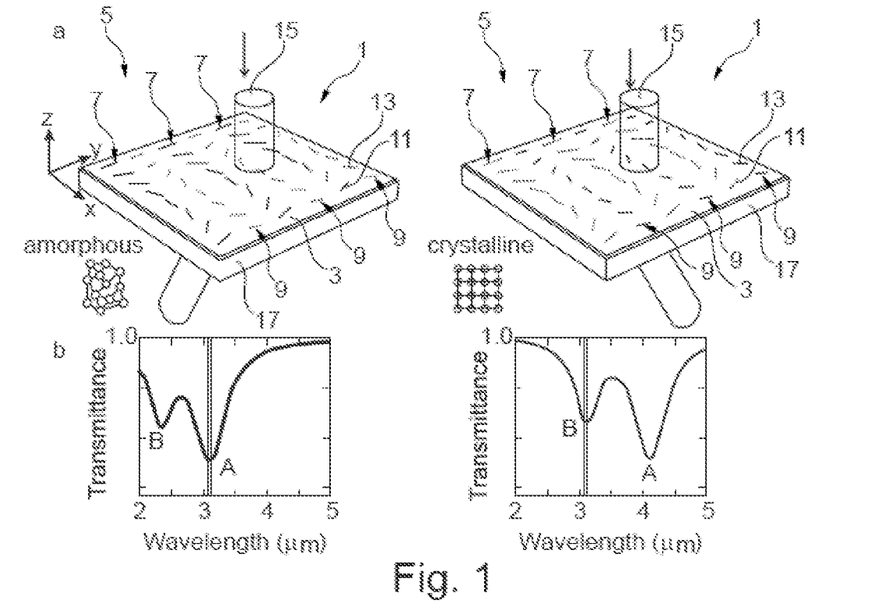
FIG. 1 shows a schematic representation of a first embodiment of a device for switchably influencing electromagnetic radiation.

FIG. 1 shows a schematic representation of the first embodiment of a device 1 for switchably influencing electromagnetic radiation. The device 1 comprises a phase change material 3, hereinafter also referred to as PCM, which is switchable between at least a first state, shown on the left in FIG. 1a, and a second state, shown on the right in FIG. 1a, wherein the first state and the second state have different electrical and/or magnetic properties. The device 1 further comprises an optically responsive structure 5 in contact with the phase change material 3, the optically responsive structure 5 having at least a first nanostructure 7 and a second nanostructure 9, the first nanostructure 7 being different from the second nanostructure 9. The first nanostructure 7 is optically responsive at a predetermined electromagnetic wavelength when the phase change material 3 is in its first state, and non-responsive at the predetermined wavelength, when the phase change material 3 is in its second state. The second nanostructure 9 is optically responsive at the predetermined electromagnetic wavelength when the phase change material 3 is in its second state and non-responsive at the predetermined wavelength when the phase change material 3 is in its first state.

The phase change material 3 preferably is metastable in at least the first state and the second state. In particular, the phase change material 3 is a dielectric in at least the first and the second state and has a first dielectric constant in the first state and a second dielectric constant, different from the first dielectric constant, in the second state. In the present embodiment of the invention, the phase change material 3 is amorphous in the first state and crystalline in the second state.

Preferably, the phase change material 3 has more than two different states, in particular a plurality of preferably metastable intermediate states between the first state and the second state, the intermediate states preferably each having an intermediate dielectric constant between the first dielectric constant and the second dielectric constant.

In the present embodiment, the phase change material 3 is GeSbTe, also referred to as GST, in particular $Ge_3Sb_2Te_6$, also referred to as GST-326.

The amorphous state of GST is also referred to hereinafter as a-GST, and the crystalline state of GST is also referred to hereinafter as c-GST.

The first nanostructure 7 comprises a plurality of first nanoelements 11, and the second nanostructure 9 comprises a plurality of second nanoelements 13. For clarity's sake, only one of the first and second nanoelements 11, 13 is assigned a respective reference numeral. The nanoelements 11, 13 are hereinafter also referred to as nano-antennas, nanorod antennas, or antennas. The first nanostructure 7 is also referred to as antenna set A. The second nanostructure is also referred to as antenna set B.

The first nanoelements 11 exhibit a plasmonic resonance at the predetermined wavelength when the phase change material 3 is in its first state, and do not exhibit a plasmonic resonance at the predetermined wavelength when the phase change material 3 is in its second state. The second nanoelements 13 exhibit a plasmonic resonance at the predetermined wavelength when the phase change material 3 is in its second state, wherein they do not exhibit a plasmonic resonance when the phase change material 3 is in its first state.

As can be clearly seen from FIG. 1a, the first nanostructure 7 and the second nanostructure 9 are arranged in the same plane on top of the phase change material 3, and the first nanoelements 11 and the second nanoelements 13 are arranged in this same plane in a staggered configuration. In particular, there are alternating lines of first nanoelements 11 and second nanoelements 13, thus the first nanostructure 7 and the second nanostructure 9 are staggered line-wise.

In another embodiment of the device 1, it is possible that the optically responsive structure 5 comprises more than two different nanostructures 7, 9, wherein preferably each nanostructure 7, 9 is assigned to a respective state of the phase change material 3, in particular each nanostructure 7, 9 exhibits an optical response in a respective state of the phase change material 3 at the predetermined wavelength, and no optical response at the predetermined wavelength in all the other states of the phase change material 3.

Further, the at least first and second nanostructures 7, 9 can have different optical functionalities, and/or at least two of the first and second nanostructures 7, 9 share a same optical functionality but show different properties within this same functionality. The latter case is true for the first embodiment shown in FIG. 1, wherein both nanostructures 7, 9 share the optical functionality of a beam steering device, but differ in the direction in which incident radiation is deflected. As schematically shown in FIG. 1a, incident radiation 15 shining from above upon the optically responsive structure 5 is deflected in a first direction by the first nanostructure 7 when the phase change material 3 is in its first state (left), and deflected to an opposite direction by the second nanostructure 9 when the phase change material 3 is in its second state (right).

The phase change material 3 preferably is arranged on a substrate 17, the substrate 17 preferably having a thermal conductivity greater than or equal to 4 W/(mK), preferably greater than or equal to 5 W/(mK), preferably greater than or equal to 9 W/(m K).

In particular, FIG. 1 shows an active plasmonic metasurface for beam steering. The active metasurface preferably consists of a 50 nm thick GST-326 layer underneath a geometric phase metasurface for beam steering. Two types of nano-antennas A and B, in particular the first and second nanoelements 11, 13, with different plasmon resonances are alternated line-wise. As shown in FIG. 1a, when the active layer is in the amorphous phase, only type A rods interact with the incident light at the predetermined wavelength of 3.1 µm and deviate the beam as shown on the left. When the active layer is in the crystalline phase, only type B rods interact with the incident light and deviate the beam into the opposite direction due to their relative orientation, as shown on the right. FIG. 1b shows a schematic depiction of transmittance of the active metasurface in the amorphous (left) and crystalline (right) state.

Figure 2:
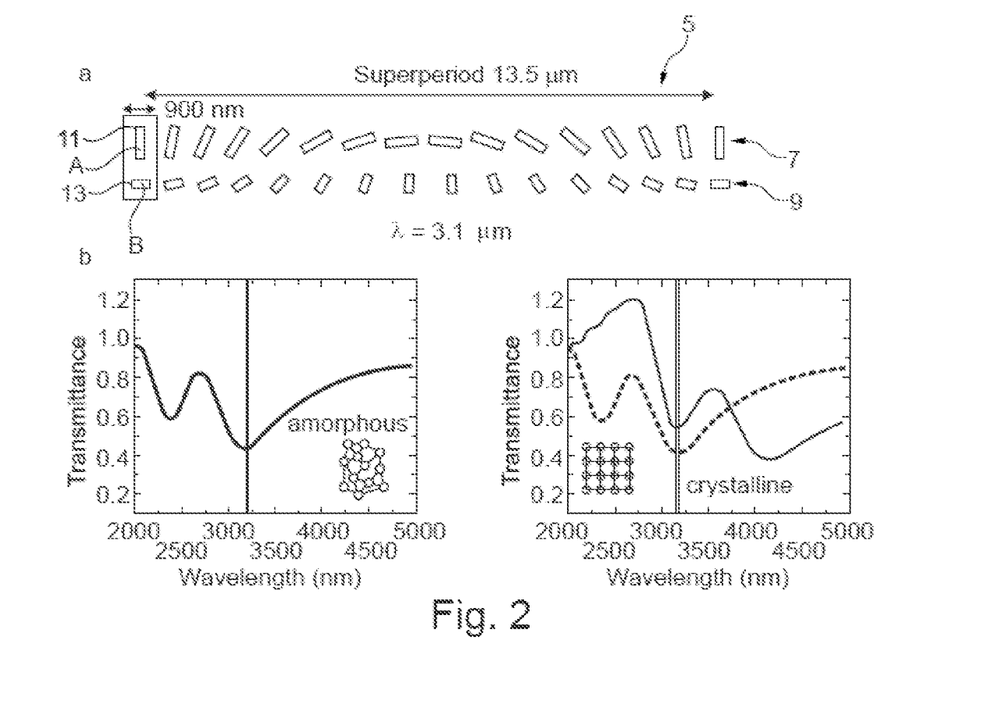
FIG. 2 shows further details of the first embodiment according to FIG. 1.

FIG. 2 shows further details of the first embodiment of the device 1 according to FIG. 1. FIG. 2a shows the fundamental building block of the optically responsive structure 5, consisting of two rows of differently sized nanoelements 11, 13, or nano-antenna elements A and B, for the first nanostructure 7 and the second nanostructure 9. Antennas A are longer and resonant at 3.1 µm for an amorphous GST substrate. The antennas are arranged such that each consecutive antenna, going from the left to the right, is clockwise rotated by preferably 12° with respect to the previous antenna. Antennas B are shorter and resonant at 3.1 µm for a crystalline state of the phase change material 3, in particular for a crystalline GST substrate. They are arranged in counter-clockwise rotation. Also shown is the periodicity of 900 nm between adjacent nanoelements 11, 13, and the superperiod of 13.5 µm for the rotation of the nanoelements 11, 13. FIG. 2b shows a simulated transmittance of the beam steering metasurface for a-GST and c-GST.

Figure 3:
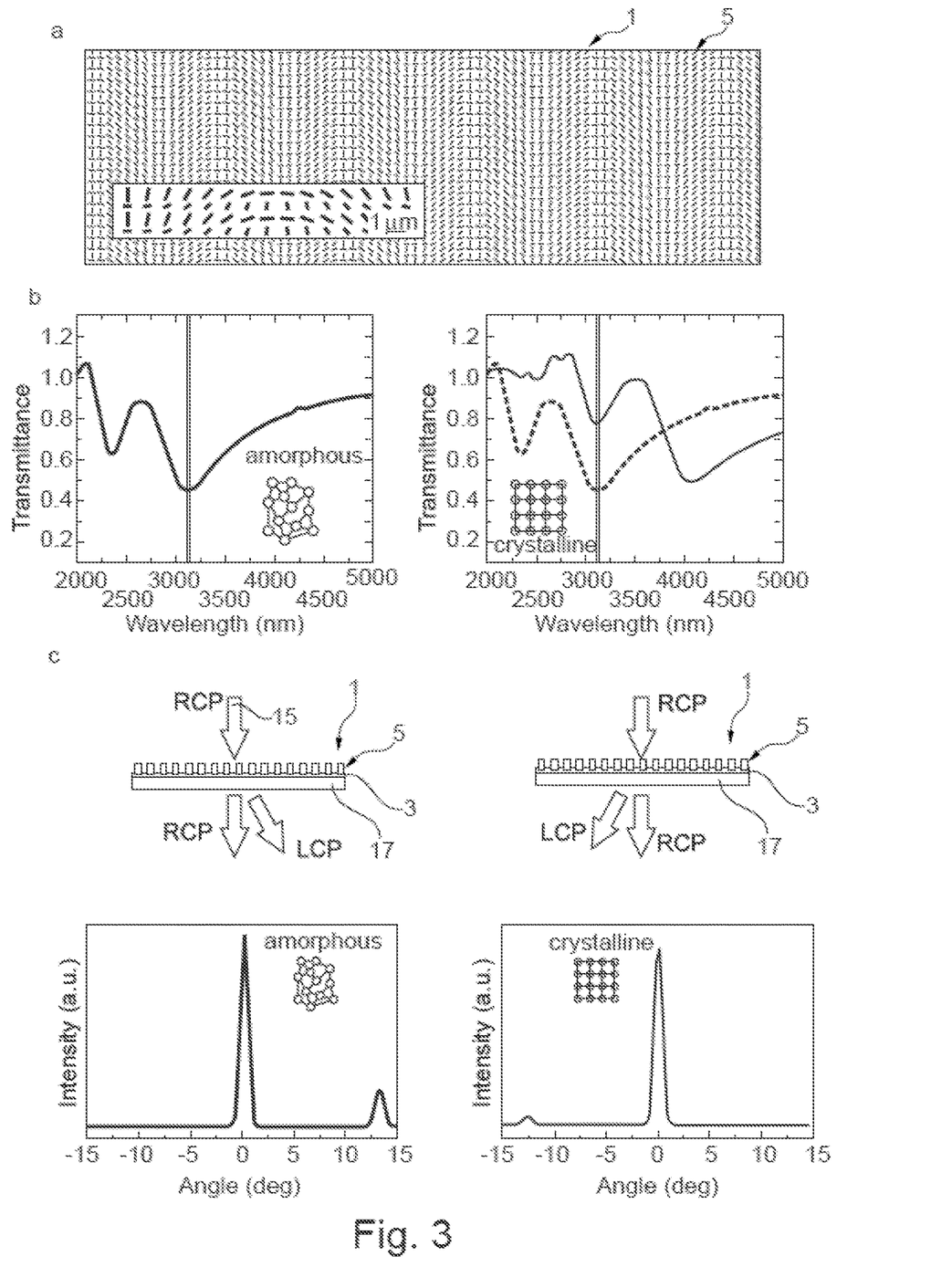
FIG. 3 shows further details of the first embodiment according to FIGS. 1 and 2.

FIG. 3a shows a schematic representation of the beam steering metasurface of the first embodiment of the device 1 according to FIGS. 1 and 2, which is preferably fabricated by electron-beam lithography. FIG. 3b shows a schematic representation of the transmittance for the fabricated metasurface in amorphous (left) and crystalline (right) state of the phase change material 3. FIG. 3c schematically shows intensity plots of the beam transmitted by the active metasurface in the amorphous (left) and crystalline (right) state of the phase change material 3. As designed, the deviated beam switches to the opposite side of the main beam when switching the phase change material 3.

Figure 4:
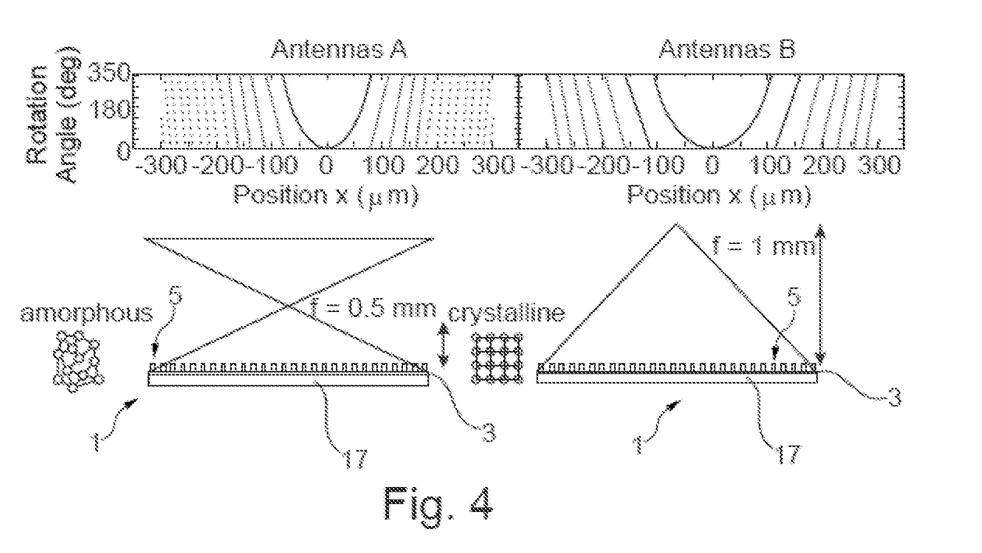
FIG. 4 shows a second embodiment of the device.

FIG. 4 shows a schematic representation of a second embodiment of the device 1 which is configured as a varifocal lens. Also in this embodiment, antennas A and B are line-wise alternated on a phase change material 3, preferably GST, which yields a cylindrical lens with varying focus depending on the type of antenna which interacts with the incident light. At FIG. 4 rotation angle versus x-position for antenna type A (left) and B (right) is shown. These distributions give rise to a focus at z=0.5 mm for amorphous GST and z=1 mm for crystalline GST in this specific embodiment.

Figure 5:
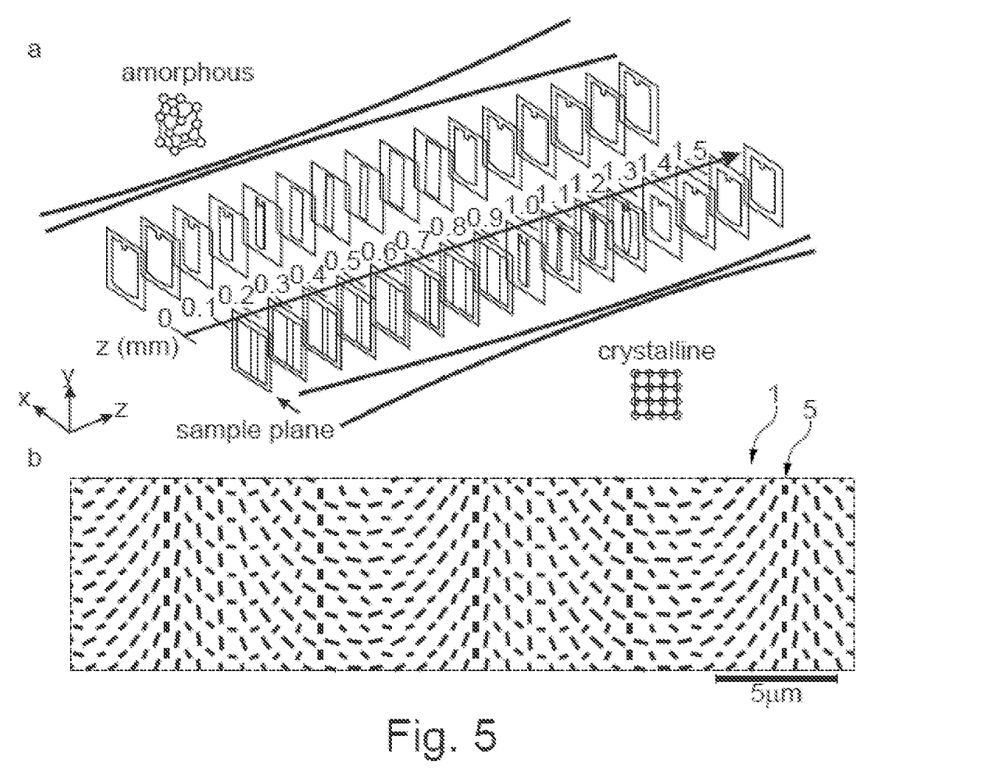
FIG. 5 shows further details of the second embodiment according to FIG. 4.

FIG. 5 shows further details of the second embodiment according to FIG. 4. FIG. 5a shows a schematic representation of camera pictures of the cylindrical varifocal zoom lens imaged at different distances z from the metasurface. Since the design is for a cylindrical lens, only the x-direction is focused. In the amorphous case of GST, a bright line appears at z=0.5 mm, whereas the image shows broad diffuse lightness at the same z-position in the crystalline case. At z=1 mm the bright line focus appears in the crystalline case whereas one can only observe a light patch in the amorphous case. FIG. 5b shows a schematic representation of a portion of the fabricated cylindrical metasurface lens.

In the following, specific embodiments of the invention are further detailed with reference to FIGS. 1 through 5:

The principle for constructing bi-functional active plasmonic devices employing a plasmonic beam-steering metasurface that refracts an incident beam in opposite directions depending on the phase of the active PCM layer is demonstrated with respect to FIG. 1. A dispersionless geometric phase approach is utilized to design abrupt phase jumps Φ at the metasurface where the relative rotation angle of a nanorod antenna is directly related to the phase that is picked up by the cross-converted fraction of incident circularly polarized light (CPL). The cross-converted field scattered by the nano-antennas arises from the dipole moment p that is induced by an incident electric field, which impinges on a dipole that forms an angle φ with the x-axis in the x-y plane as follows:

$$P_{L(R)} = 1/\sqrt{2}\alpha(e_{L(R)} \pm e^{\pm i2\varphi}e_{R(L)})$$

where α is the electronic polarizability, the subscripts R and L denote right- and left-handed circularly polarized light (RCP, LCP), respectively, and $e_{L(R)}$ are the unit vectors for left- and right-handed circularly polarized light. The sign in the exponent depends on the combination incidence/transmission and is + for LCP/RCP and − for RCP/LCP. Thus, a continuously full 0 to 2π range of abrupt phase jumps Φ=2φ can be realized by rotating the electric dipole, i.e., a plasmonic nanorod antenna, in the x-y plane from 0 to π. Therefore, arranging m nanorods equally spaced over a superperiod □ with relative rotation angles of π/m in between adjacent elements yields a constant phase gradient dΦ/dx. The generalized Snell's law for the converted circularly polarized light is then $$n_t \sin \theta_t - n_i \sin \theta_i = \frac{\lambda_0}{2\pi}\frac{d\Phi}{dx} = \pm\frac{\lambda_0}{\pi}\frac{d\varphi}{dx} = \pm\frac{\lambda_0}{\Lambda}.$$

Using this principle, the unit cell of the beam-steering active plasmonic metasurface is constructed to consist of two rows of m=15 antennas A and B with lengths $l_A$=600 nm and $l_B$=370 nm, thicknesses $t_A$=$t_B$=40 nm, and widths $w_A$=$w_B$=50 nm. The antennas are made of gold and are equally spaced in x-direction with periodicity p=900 nm, and the distance between rows A and B is d=550 nm (FIG. 2a). This results in plasmon resonances at $\lambda_0$=3.1 μm for antennas A on an a-GST layer and antennas B on a c-GST layer. The superperiod □ is 13.5 μm, which yields a refraction angle of $\theta_t$=±13.28°, depending on the helicity of the incident light. The nanorods in the upper row are rotated clockwise going from left to right whereas those in the lower row are rotated anti-clockwise leading to opposite refraction angles for the same helicity of incident circularly polarized light. Full-field finite-difference time-domain simulations were carried out for the unit cell with periodic boundary conditions in x- and y-directions. The metasurface is located at z=0 and illuminated from the top at normal incidence with RCP light. The resulting phase profile of a cut through the x-z-plane demonstrates the refraction to opposite angles for cross-converted light (LCP) for a-GST and c-GST. The normalized transmittance spectra reveal that antennas A are resonant around 3.1 μm in the a-GST case, whereas antennas B's resonance shifts to this spectral position in the c-GST case. The state of the phase change material 3 thus selects whether antenna set A or B interacts with the incident light.

The design is using fabricated electron beam lithography over an area of 600 μm×600 μm to define the plasmonic gold nanorods. As substrate, $CaF_2$ is used with a 50 nm thick layer of GST-326 followed by a 15 nm thick $ZnS:SiO_2$ capping layer to prevent oxidation. To verify the switching behaviour of the active metasurface fabricated, Fourier transform infrared (FTIR) spectroscopy measurements were carried out using a Bruker Vertex 80 coupled to a microscope. As designed, the plasmon resonance of the longer nanorods A lies at 3.15 μm for a-GST whereas the shorter nanorods B exhibit a resonance at 2.28 μm. After inducing crystallization by heating the sample on a hot plate for 2 min at 180° C., the plasmon resonance associated with nanorod set B is shifted to 3.15 μm, which excellently coincides with the resonance position of antenna set A in the a-GST case. Simultaneously, the plasmon resonance of antenna set A is shifted out of the region of interest to 4.1 μm. In both the amorphous and crystalline states, the sample was characterized at 3.1 μm wavelength using an optical parametric master oscillator power amplifier (MOPA) system that outputs linearly polarized light. Further a quarter-waveplate was inserted before the sample to generate circularly polarized light and the resulting far field image was recorded with a pyroelectric array camera (Pyrocam III, Ophir Photonics). The results are schematically shown in FIG. 3c. When the GST is in its amorphous state, antenna set A interacts with the incident light and refracts the cross converted portion of the incoming beam (LCP) to the right side of the nonconverted RCP part, which is subjected to the conventional Snell's law and therefore does not change its propagation direction. The measured deviation angle is 13.23°, in good agreement with the theoretical value of 13.28°, which can be obtained using $\alpha=\sin^{-1}(\lambda_0/\Lambda)$. For crystalline GST, the incident beam interacts with antenna set B, thus, the converted portion is refracted to the opposite direction. The relative intensity of the anomalously refracted beam in the c-GST case is lower than in the a-GST case because the scattering of the plasmon resonance of antenna set B is weaker as can be seen in FIG. 3b. This is due to the fact that the dipole strength of the shorter nanorods used for antenna set B is weaker, which is further reduced by the higher real and imaginary parts of the refractive index of c-GST. One can partially counteract this decrease in plasmon resonance amplitude by using thicker and longer nanorods for antenna set B or using two rows for each single row of antenna set A or by developing even less lossy PCMs. The measured relative efficiency, given by the intensity ratio of the anomalously refracted beam to the incident beam, is approximately 5% in accordance with previously reported values.

As second embodiment a varifocal cylindrical plasmonic metasurface zoom lens is demonstrated. The required spatial phase profile with the corresponding rotation angles (FIG. 4) for nanorods in antenna sets A and B are calculated over an area of 600 μm using the formula for diffractive cylindrical lenses $$\varphi(x)=0.5k_0(\sqrt{f^2+x^2}-|f|),$$

where φ denotes the rotation angle, f the focal length, $k_0$ the free space wavevector and x the associated x-position of the nanorod.

In particular, focal lengths $f_A$=0.5 mm for antenna set A and $f_B$=1 mm for antenna set B are used, i.e., for amorphous GST, the focus will lie at 0.5 mm and for crystalline GST at 1 mm. The incident polarization is RCP such that the metalens will operate as converging lens. The periodicity is kept at 900 nm in x-direction and 110 nm in y-direction with a center-to-center distance between antenna sets A and B at 550 nm.

Full-field simulations were carried out over a 650 μm simulation domain with perfectly-matched layers as boundaries and incident RCP plane-wave illumination at 3.1 μm to verify the performance of our design. The results reveal that indeed focusing occurs in both the amorphous and crystalline case at the chosen z-positions. The design was fabricated using the same procedure as before and the sample was characterized at 3.1 µm wavelength with the MOPA source. Using a quarter waveplate before the active metalens, RCP was generated from the linearly polarized MOPA output and subsequently filtered with an identical quarter waveplate and a linear polarizer for converted LCP light. Using a microscope with 20× magnification, different z=const. planes are imaged, revealing the beam shape at different distances from the varifocal plasmonic zoom lens. The resulting images for the sample plane and z=0.5 and 1 mm-distances are schematically shown in FIG. 5a. When the GST is in the amorphous state, as before, only antenna set A interacts with the incoming light, thus imprinting the phase profile that creates a focus at z=0.5 mm, which leads to a bright line focus at this distance. After inducing a phase change to the crystalline state, as designed, antenna set B defines the functionality of the metalens. This manifests as a focal line that becomes visible at z=1 mm.

The device 1 as proposed has the benefit that it is highly-integrated in a layered fashion without relying on any mechanical motion or reconfiguration. While the specific embodiments explained above are restricted to interweaving only two functionalities per sample, it is also possible to utilize more sets of nanorods with distinct resonances. The GST layer can be partly switched to generate intermediate refractive indices that select for the different antenna sets whereby each of these states would be metastable by themselves. The limiting factor lies therein that more antenna sets would equal less area coverage per antenna set and therefore a weaker individual performance. However, since the functionality is only imprinted on the converted part of the beam, one can easily filter out any light that passes through the metasurface without interacting. Furthermore, a whole range of PCMs exists that all have unique optical properties such that an additional design parameter is readily available through the choice of a particular PCM.

One is not restricted to combining similar functionalities into one active metasurface: one can easily "mix-and-match" entirely different optical components in one active metasurface and thus create highly-integrated multi-purpose nanophotonic components. Furthermore, while the specific demonstration given here relies on one-directional hot-plate induced phase change, it is well-known that GST can be reversibly electrically and optically switched on ultrafast time-scales. Overall, the approach presented creates a new design principle that can be explored in many directions ranging from on-demand nanophotonic components, such as novel scanners combining beam steering and lensing, to dynamic phased-array optics for aberration correction and active holography.

The device 1 can be obtained by a method comprising the steps of providing the phase change material, preferably depositing the phase change material 3 on a substrate surface of a substrate 17, the phase change material 3 being switchable between at least a first state and the second state, wherein the first state and the second state have different electrical and/or magnetic properties; providing an optically responsive structure 5 in contact with the phase change material 3 by providing at least a first nanostructure 7 and a second nanostructure 9 in contact with the phase change material 3, such that the first nanostructure 7 is different from the second nanostructure 9, and the first nanostructure 7 is optically responsive at the predetermined electromagnetic wavelength when the phase change material 3 is in its first state and non-responsive at the predetermined wavelength when the phase change material 3 is in its second state, and the second nanostructure 9 is optically responsive at the predetermined electromagnetic wavelength when the phase change material 3 is in its second state and non-responsive at the predetermined wavelength when the phase change material 3 is in its first state.

Preferably, for each nanostructure 7, 9 a plurality of nanoelements 11, 13 is provided, the nanoelements 11, 13 exhibiting plasmonic resonances at the predetermined wavelength in the respective states of the phase change material 3 assigned to the respective nanostructure 7, 9, and the nanoelements 11, 13 being optically non-responsive in any other state of the phase change material 3.

Preferably, the nanoelements 11, 13 of at least the first nanostructure 7 and the second nanostructure 9 are deposited in a same plane on the phase change material 3, preferably in a staggered configuration.

In particular, the device 1 may be obtained by the following steps: a 50 nm GST-326 film is DC-magnetron sputter-deposited with a background pressure of $2\times10^{-6}$ mbar and 20 sccm Ar flow followed by sputtering of 15 nm of $ZnS:SiO_2$. Subsequently, the metasurface is prepared using electron beam lithography employing a polymethylmethacrylate (PMMA) double layer resist, where the first layer is 100 nm 3.5% 200K PMMA and the second layer 100 nm 1.5% 950K PMMA. The resist is baked for 2 min. at 120° C. after each layer. After development in 3:1 MIBK: isopropyl alcohol, 2 nm of chromium followed by 40 nm of gold is thermally evaporated and a lift-off is carried out.

The invention claimed is:

1. A device for switchably influencing electromagnetic radiation, comprising:
   a phase change material being switchable between at least a first state and a second state, the first state and the second state having different electrical and/or magnetic properties; and
   an optically responsive structure in contact with the phase change material, the optically responsive structure having at least a first nanostructure and a second nanostructure, the first nanostructure being different from the second nanostructure;
   wherein the first nanostructure is being optically responsive at a predetermined electromagnetic wavelength when the phase change material is in the first state, and non-responsive at the predetermined wavelength when the phase change material is in the second state,
   wherein the second nanostructure is optically responsive at the predetermined electromagnetic wavelength when the phase change material is in the second state, and non-responsive at the predetermined wavelength when the phase change material is in the first state, and
   wherein:
      the first nanostructure and second nanostructure have different optical functionalities, and/or
      at least two nanostructures of the first nanostructure and the second nanostructure share a same optical functionality but show different properties within this same functionality.

2. The device according to claim 1, wherein the phase change material is metastable in at least the first state and the second state.

3. The device according to claim 1, wherein:
   the phase change material is a dielectric in at least the first state and the second state and has a first dielectric constant in the first state and a second dielectric constant, different from the first dielectric constant, in the second state, and/or the phase change material is amorphous in the first state and crystalline in the second state, and/or the phase change material has more than to two different states, and/or the phase change material (3) has a plurality of preferably metastable intermediate states between the first state and the second state, the intermediate states preferably each having an intermediate dielectric constant between the first dielectric constant and the second dielectric constant.

4. The device according to claim 1, wherein the phase change material is GeSbTe, in particular $Ge_3Sb_2Te_6$.

5. The device according to claim 1, wherein the first nanostructure comprises a plurality of first nanoelements exhibiting a plasmonic resonance at the predetermined wavelength when the phase change material is in its first state, and not exhibiting a plasmonic resonance at the predetermined wavelength when the phase change material is in its second state, wherein the second nanostructure comprises a plurality of second nanoelements exhibiting a plasmonic resonance at the predetermined wavelength when the phase change material is in its second state and not exhibiting a plasmonic resonance at the predetermined wavelength when the phase change material is in its first state.

6. The device according to claim 1, wherein:
the first nanostructure and the second nanostructure are arranged in the same plane, and/or
the first nanostructure and the second nanostructure are arranged in the same plane in a staggered configuration.

7. The device according to claim 1, wherein the optically responsive structure comprises more than two different nanostructures, wherein preferably each nanostructure is assigned to a respective state of the phase change material, in particular each nanostructure exhibiting an optical response in a respective state of the phase change material at the predetermined wavelength, and no optical response at the predetermined wavelength in the other states of the phase change material.

8. The device according to claim 1, wherein the phase change material is arranged on a substrate, the substrate having a thermal conductivity greater than or equal to 4 W/(mK), preferably greater than or equal to 5 W/(mK), preferably greater than or equal to 9 W/(mK).

9. The device according to claim 1, wherein the first nanostructure and the second nanostructure are configured to have different optical functionalities.

10. The device according claim 1, wherein at least two nanostructures of the first nanostructure and of the second nanostructure are configured to share a same optical functionality, but to exhibit different properties within the same functionality.

11. The device according claim 1, wherein:
the first nanostructure and the second nanostructure are configured to have different optical functionalities, and
at least two nanostructures of the first nanostructure and the second nanostructure are configured to share a same optical functionality, but to exhibit different properties within the same functionality.

12. The device according to claim 1, wherein the first nanostructure is configured to reflect light in a first direction when the phase change material is in the first state and the second nanostructure is configured to reflect light in a second direction that is opposite the first direction when the phase change material is in the second state.

13. The device according to claim 1, wherein the first nanostructure is configured as a beam reflector when the phase change material is in the first state and the second nanostructure is configured as a varifocal zoom lens when the phase change material is in the second state.

14. A device for switchably influencing electromagnetic radiation, the device comprising:
a phase change material being switchable between at least a first state and a second state, the first state and the second state having different electrical and/or magnetic properties; and
an optically responsive structure in contact with the phase change material, the optically responsive structure having at least a first nanostructure and a second nanostructure, the first nanostructure being different from the second nanostructure;
wherein the first nanostructure is being optically responsive at a predetermined electromagnetic wavelength when the phase change material is in the first state, and non-responsive at the predetermined wavelength when the phase change material is in the second state,
wherein the second nanostructure is optically responsive at the predetermined electromagnetic wavelength when the phase change material is in the second state, and non-responsive at the predetermined wavelength when the phase change material is in the first state, and
wherein the device is selected from a group consisting of a beam steering device, a varifocal lens, and chiral lens.

15. A method for obtaining a device for switchably influencing electromagnetic radiation, the method comprising:
providing a phase change material, the phase change material being switchable between at least a first state and a second state, the first state and the second state having different electrical and/or magnetic properties;
providing an optically responsive structure in contact with the phase change material by providing at least a first nanostructure and a second nanostructure in contact with the phase change material, such that the first nanostructure is different from the second nanostructure, and the first nanostructure is optically responsive at a predetermined electromagnetic wavelength when the phase change material is in its first state and non-responsive at the predetermined wavelength when the phase change material is in its second state, and the second nanostructure is optically responsive at the predetermined electromagnetic wavelength when the phase change material is in its second state and non-responsive at the predetermined wavelength when the phase change material is in its first state,
wherein:
the first nanostructure and second nanostructure have different optical functionalities, and/or
at least two nanostructures of the first nanostructure and the second nanostructure share a same optical functionality but show different properties within this same functionality.

16. The method according to claim 15, wherein for each nanostructure a plurality of nanoelements is provided, the nanoelements of each respective nanostructure exhibiting plasmonic resonances at the predetermined wavelength in a respective state of the phase change material assigned to the respective nanostructure, and the nanoelements of the respective nanostructure being optically non-responsive in any other state of the phase change material.

17. The method according to claim 15, wherein the nanostructure of at least the first nanostructure and the second nanostructure are deposited in a same plane on the phase change material.

18. The method according to claim 17, wherein the nanostructure of at least the first and second nanostructures are deposited in a staggered configuration.

19. The method according to claim 15, wherein the device is selected from a group consisting of a beam steering device, a varifocal lens, and chiral lens.

* * * * *

UNITED STATES PATENT AND TRADEMARK OFFICE
CERTIFICATE OF CORRECTION

Page 1 of 1

PATENT NO. : 10,593,873 B2
APPLICATION NO. : 15/992264
DATED : March 17, 2020
INVENTOR(S) : Harald Giessen and Xinghui Yin It is certified that error appears in the above-identified patent and that said Letters Patent is hereby corrected as shown below:

On the Title Page

Item (72), Inventors:
Harald Giessen, Mannheim (DE)
Xinghui Yin, Cambridge, MA (US)

Should read:
Harald Giessen, Marnheim (DE)
Xinghui Yin, Cambridge, MA (US)

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*